United States Patent [19]

Zielinski

[11] 4,157,509

[45] Jun. 5, 1979

[54] VARIABLE REFERENCE SIGNAL GENERATING CIRCUIT AND ANALOG COMPARATOR UTILIZING HYSTERESIS

[75] Inventor: Martin Zielinski, Roslyn, Pa.

[73] Assignee: Honeywell Inc., Minneapolis, Minn.

[21] Appl. No.: 806,077

[22] Filed: Jun. 13, 1977

[51] Int. Cl.² ...................... H03K 5/153; H03K 5/20
[52] U.S. Cl. .................................. 328/147; 307/354; 307/360; 328/116
[58] Field of Search ............... 307/354, 356, 360, 290; 328/115, 146, 147, 148

[56] References Cited

U.S. PATENT DOCUMENTS

| 3,416,004 | 12/1968 | Taylor | 307/290 X |
| 3,813,665 | 5/1974 | Parfomak et al. | 328/148 X |
| 4,007,382 | 2/1977 | Warberg | 307/360 X |

Primary Examiner—John Zazworsky
Attorney, Agent, or Firm—Laurence J. Marhoefer; Lockwood D. Burton; Mitchell J. Halista

[57] ABSTRACT

A variable reference signal generating circuit concurrently generating a high and a low reference signal and an analogue signal comparator having hysteresis are used to compare an input signal with the high and low reference signals to determine the relative level of the input signal with respect to the limits defined by the high and low reference signals. The signal comparators are switching comparators with hysteresis which switch their outputs between high and low levels in response to the detection of a change in a relative magnitude between the input signal and the reference signals. For an input close to the switching threshold of a comparator, the comparator may maintain an output level indicative of a prior relationship between the input signal and the reference signal while the input signal has actually changed to a magnitude which should be represented by a change in the comparator output level. This error is a result of the hysteresis loop defining the operation of the comparator near its threshold level whereby the output of the comparator may be on the incorrect side of the hysteresis loop to maintain an incorrect output. To correct the comparator output signal from such an erroneous indication, the reference signal generating circuit is momentarily modified to produce a new pair of high and low reference signals which are displaced above and below the steady state reference signals, respectively. Such a displacement of the reference signal levels will result in a correction of the comparator output signal level since the difference between the input signal and the reference signal is substantially increased beyond the resulting hysteresis loop of the comparator, i.e., the input signal is outside of the modified comparator hysteresis loop which is based on the displaced reference signals.

10 Claims, 5 Drawing Figures

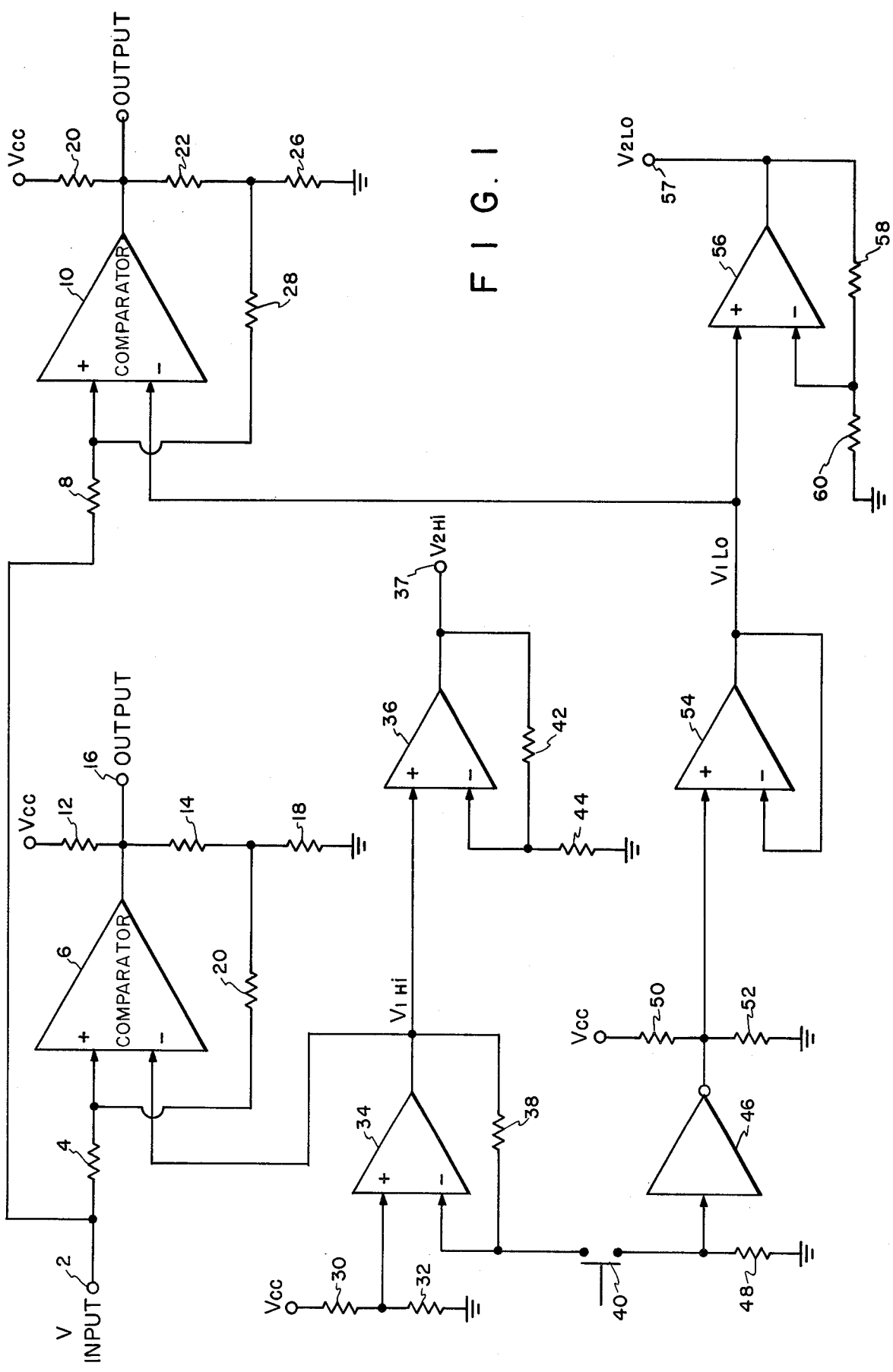
F I G. I

VARIABLE REFERENCE SIGNAL GENERATING CIRCUIT AND ANALOG COMPARATOR UTILIZING HYSTERESIS

BACKGROUND OF THE INVENTION

1. Field of the Invention

The present invention is directed to signal comparators. More specifically, the present invention is directed to signal comparators having hysteresis in their operation.

2. Description of the Prior Art

The use of analog signal comparators to provide a digital output signal represented by a change in level, i.e., a "zero" level and a "one" level, representative of the relative magnitudes of the compared signals is well-known in the prior art. To improve the comparator operation when the compared reference and input signal values are close in magnitude, i.e., the difference approaches zero, the prior art analog signal comparators have been operated in a so-called hysteresis mode of operation. Such a hysteresis mode of operation is well-known in the prior art, e.g., the circuit shown in U.S. Pat. No. 3,531,726. Briefly, a feedback hysteresis is developed from the output of the comparator and is fed back to the input thereof through a feedback resistor. Prior art attempts to overcome the problems occasioned by the use of such a hysteresis mode of operation have included switching the comparator out of the hysteresis mode of operation when it is desired to overcome the problems associated with hysteresis mode of operation. One of these problems arises when the compared signals are close to each other and involves the fact that the hysteresis switching occurs at a threshold voltage of the comparator rather than at the reference signal level. Thus, if the input signal is within the hysteresis loop the output of the comparator may be at an incorrect level since the hysteresis loop may maintain the comparator output level even though the input signal may actually have returned past the reference signal level. Accordingly, it is desirable to provide a comparator circuit with hysteresis having a capability for correcting the aforesaid problem associated with hysteresis comparators during a comparison of signals that are close to one another in magnitude.

SUMMARY OF THE INVENTION

An object of the present invention is to provide an improved hysteresis type comparator circuit.

A further object of the present invention is to provide an improved variable reference signal generator circuit for selectively producing a first and a second pair of reference signals.

In accomplishing these and other objects, there has been provided, in accordance with the present invention, a first and a second hysteresis type signal comparator and a reference signal generator having a first pair of reference signals and a second pair of reference signals with means for selectively operating the signal generator to produce the first and second pair of reference signals. The reference signal generator includes a first operational amplifier for producing a first output signal in response to a fixed input signal applied thereto and means for selectively changing the effective gain of the operational amplifier by altering the feedback signal applied thereto. The altered feedback signal is also applied to a second operational amplifier to produce a concurrent change in a second reference signal level from a first signal level by affecting a fixed reference signal applied to the second operational amplifier.

BRIEF DESCRIPTION OF THE DRAWING

A better understanding of the present invention may be had when the following detailed description is read in connection with the accompanying drawing, in which:

FIG. 1 is a schematic illustration of a signal comparator circuit embodying the present invention.

DESCRIPTION OF THE PREFERRED EMBODIMENT

DETAILED DESCRIPTION

Figure 2A:
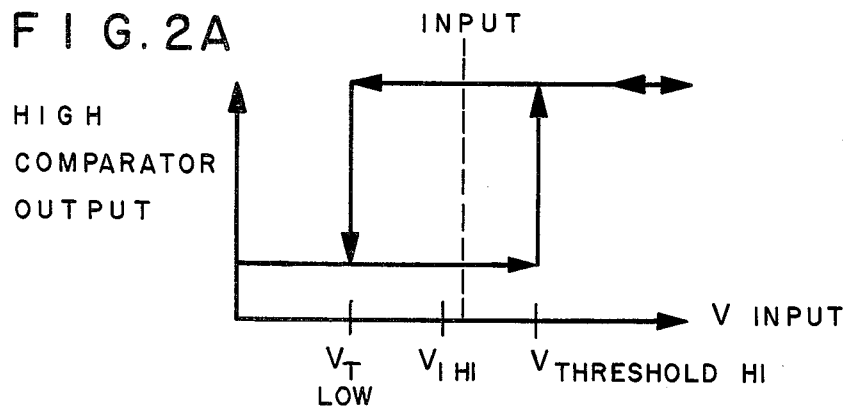
FIGS. 2A to 2D are waveshape diagrams illustrating the operation of the circuit shown in FIG. 1.

Referring to FIG. 1 in more detail, there is shown a signal comparator circuit having an input terminal 2 for connection to a source of an input signal V to be compared with high and low reference level signals. The input terminal 2 is connected through a first resistor 4 to a non-inverting input of a first, or high level, comparator 6. Concurrently, the input terminal 2 is connected through a second resistor 8 to a second, or low level, comparator 10. The comparators 6 and 10 are switching comparators which switch their output signal level between a first and a second level in response to an input signal below and above a reference signal level, respectively, such devices being well-known in ther art. The output of the first comparator is connected to the junction between a series pair of resistors 12 and 14 and to an output terminal 16. One end of the series pair of resistors 12 and 14 is connected to a voltage source Vcc while the other end is connected through a resistor 18 to ground. The junction between the series resistors 12 and 14 and the resistor 18 is connected by a feedback resistor 20 to the non-inverting input of the first comparator 6. Similarly, the output of the second comparator 10 is connected to the junction between a pair of series resistors 20 and 22 and to an output terminal 24. One end of the series resistors 20 and 22 is connected to the voltage source Vcc while the other end is connected through a resistor 26 to ground. The junction between the series resistors 20 and 22 and the resistor 26 is connected by a feedback resistor 28 to the non-inverting input terminal of a comparator 10. The inverting inputs of the comparator 6 and 10 are connected to respective sources of reference signals, i.e., the first comparator 6 is connected to a source of a high level reference signal, and the second comparator 10 is connected to a source of a low reference signal.

The high and low reference signal levels are obtained from respective high and low reference signal generating circuits as shown in FIG. 1. Specifically, a pair of resistors 30 and 32 are connected in series between the voltage source Vcc and ground. A junction between the resistors 30 and 32 is connected to the non-inverting input of the first operational amplifier 34. The output of the first amplifier 34 is connected to the inverting input of the first comparator 6 as a source of a high level reference signal $V_{1Hi}$ and to the non-inverting input of a second operational amplifier 36. The output of the first amplifier 34 is also connected through a feedback resistor 38 to the inverting input thereof. The inverting input of the first amplifier 34 is connected to one side of a single pole, single throw switch 40. The output of the second amplifier 36 is connected to an output terminal 37 as a source of a second high level reference signal $V_{2Hi}$ and through a feedback resistor 42 to the inverting input of the second amplifier 36. The inverting input of the second amplifier 36 is connected through a resistor 44 to ground. The other side of the switch 40 is connected to the input of an inverter 46 and through a resistor 48 to ground. The output of the inverter 46 is connected to the junction of a pair of series resistors 50 and 52. The resistors 50 and 52 are connected between the voltage source Vcc and ground. This junction is also connected to the non-inverting input of a third amplifier 54. The output of the third amplifier 54 is connected to the inverting input thereof and to the inverting input of the second comparator 10 as a source of a low level reference signal $V_{1Lo}$. The output of the third amplifier 54 is connected to the non-inverting of a fourth amplifier 56. The output of the fourth amplifier 56 is also connected to an output terminal 57 as a source of a second low level reference signal $V_{2Lo}$ and through a feedback resistor 58 to the inverting input thereof connected through resistor 60 to ground.

MODE OF OPERATION

In operation, the first comparator 6 used in the comparator circuit of the present invention is arranged to compare an input signal applied to input terminal 2 with a high level reference signal $V_{1Hi}$ from the output of the first operational amplifier 34. The first high level reference signal $V_{1Hi}$ is a function of the input signal to the amplifier 34 derived from the voltage divider resistors 30 and 32 and the gain of the amplifier as determined by the amplifier feedback loop including the feedback resistor 38. Concurrently, a first low level reference signal $V_{1Lo}$ from the output of the third amplifier 54 is compared by the second comparator 10 with the input signal. The first low level reference signal $V_{1Lo}$ is a function of the input signal to the amplifier 54 from the voltage divider resistors 50 and 52 and the gain of the amplifier 54 as determined by the amplifier feedback loop. When the switch 40 is open, the inverter 46 has no effect on the input signal to the amplifier 54 since the inverter input is connected to ground through the resistor 48. Also, the inverter circuit 46 is a so-called open collector circuit which has an open collector transistor in its output circuit during the "off" state of the inverter to prevent an inverter output signal, such a circuit being well-known in the art.

The comparators 6 and 10 are each arranged to switch their output levels upon the detection of a change in a relative magnitude of the compared input signals, i.e., the output signal of the comparator is switched between a high and a low output level signal and vice versa. Further, the comparators 6 and 10 are each operated in a well-known hysteresis type of operation by the use of the feedback loop to the non-inverting input thereof. However, there are threshold levels within the comparator which are determined by the actual signal level above and below the reference level which must be reached before the comparator will actually switch its output level. The operation of such a comparator is illustrated in FIG. 2A for a high reference level comparison and in FIG. 2C for a low reference level comparison. Thus, for the high reference level comparison by the comparator 6 when the V input is either equal to or exceeds the $V_{Threshold\ Hi}$, the comparator output switches to a high level output. Conversely, when the V input is lower than the $V_{Threshold\ Lo}$, the comparator output switches to a low level output. Similarly, for a low reference level comparison, by the comparator 10, when $V\ input \leq V_{Threshold\ Lo}$, the comparator output switches to a low level output, and when $V\ input > V_{Threshold\ Lo}$, the comparator output switches to a high level output.

The problem with such a prior art hysteresis mode of operation arises when, in the case of a high reference level comparison, the final value of the input signal is between the threshold levels after changing from a level past the threshold levels. In such a sequence of operation, the comparator 6, for example, would have switched to a high output and would retain this output even though the actual input voltage is below the $V_{Threshold\ Hi}$ level. Thus, the comparator operation is held on the wrong side of the hysteresis loop and does not switch its output level to indicate that the V input is actually below the $V_{Threshold\ Hi}$ level. Similarly, for a low reference level comparison, the V input signal upon a decrease past the $V_{Threshold\ Lo}$ level produces a comparator output switch to a low level comparator output signal which is retained even though the V input may subsequently be increased above the $V_{Threshold\ Lo}$ level. Thus, the resulting comparator output is incorrect since it is not switched to indicate that the V input is actually past the reference signal level.

Figure 2B:
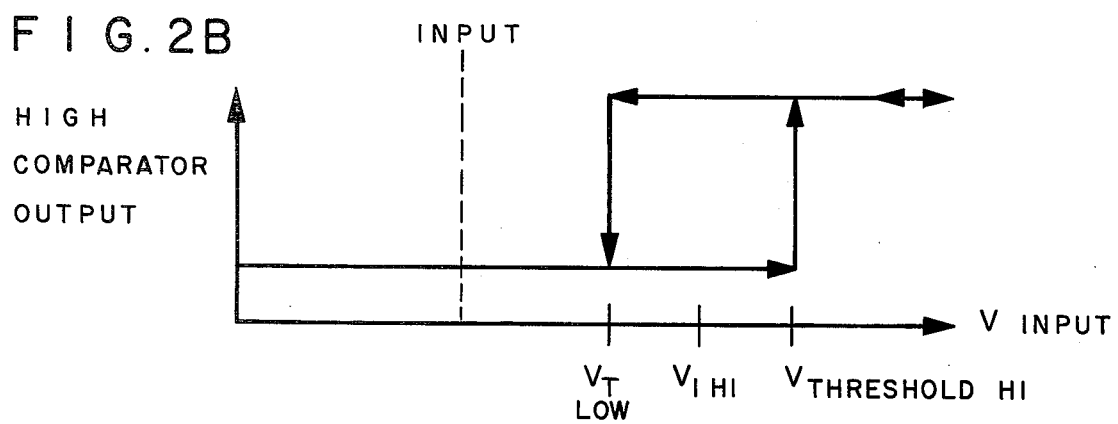
Figure 2C:
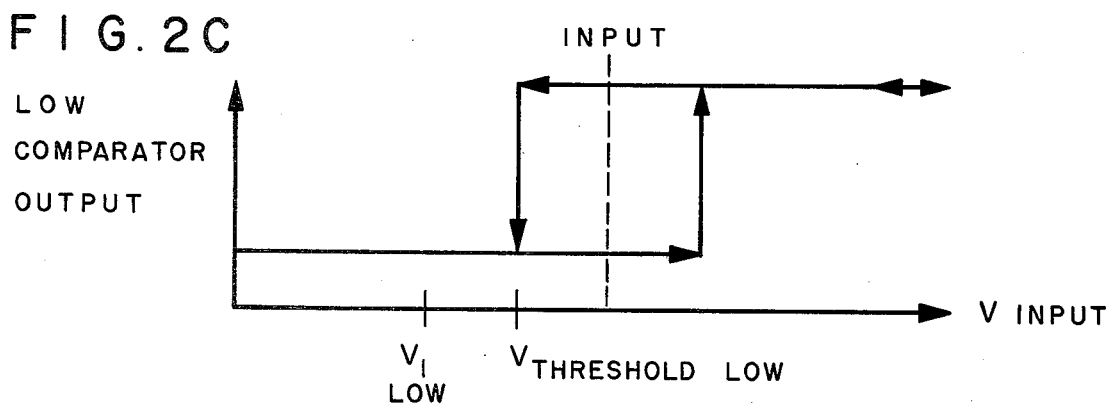
Figure 2D:
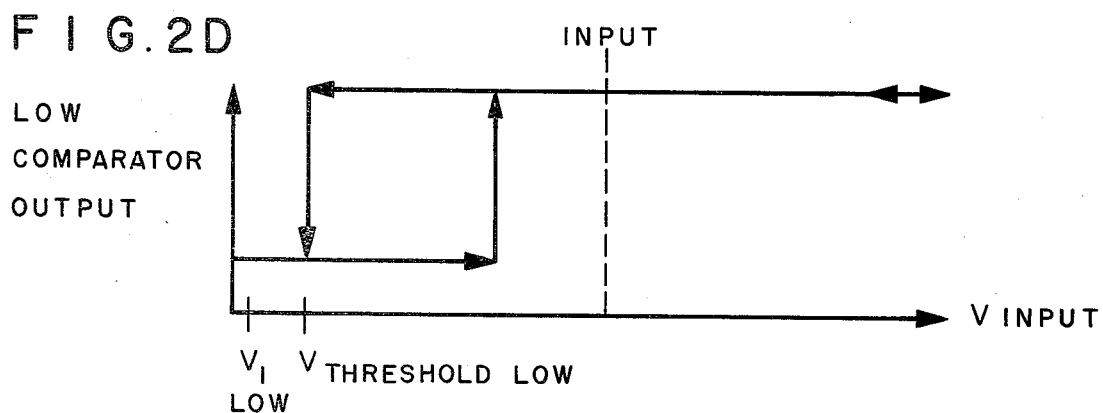

In order to correct this problem for either the low or high reference level comparison operation, the reference signal generating circuit of the present invention is arranged to selectively provide an increase in the $V_{1Hi}$ reference level and a decrease in the $V_{1Lo}$ reference level. This temporary change is effected by a momentary operation of the switch 40. Thus, if an error indication is being produced by either of the comparators 6 and 10, e.g., by having the comparator output signals drive conventional indicators (not shown), the comparison operation can be checked for a correct error indication by momentarily closing the switch 40. The close of the switch 40 changes the output of the first amplifier 34 since the feedback resistor 38 and the resistor 48 now function as a voltage divider. Thus, the former $V_{1Hi}$ was determined by $(R_{32}/R_{30}+R_{32})$ Vcc and the new $V_{1Hi}$ is the same quantity multiplied by $(1+R_{38}/R_{48})$. The input to the inverter 46 is $(R_{32}/R_{30}+R_{32})$ Vcc which signal turns "on" the open collector output transistor to saturation. The saturation voltage of this transistor is applied to the input of the unity gain amplifier 54 to produce concurrently the new $V_{1Lo}$. These changes, of course, produce corresponding changes in the $V_{2Hi}$ and $V_{2Lo}$ reference level signals which are used for other comparison operations and which can be concurrently checked in a similar fashion. The high and low comparison operations produced by this change in the high and low reference level signals is shown in FIGS. 2B and 2D, respectively. Since the input signal is now substantially past the comparator threshold levels, the comparators 6, 10 switch their output levels if the incorrect type of output level was present as discussed above.

The switch 40 is subsequently released and the comparison operation is now restored to the original reference signal levels. However, the comparator output levels have been switched to the correct levels. For example, the high level comparator 6 has a low level output level to indicate that the V input is actually below the $V_{Threshold\ Hi}$ level. Similarly, if a low comparison operation is executed, the output level of the low level comparator 10 is switched to a correct high level output signal. If the aforesaid visual monitors are used with the comparator 6 and 10, the aforesaid comparison correction operation induced by the switch 40 will produce either a change in the indication to verify that an incorrect comparison output level was present or no change in the indication to verify that the comparison output level was correct.

Accordingly, it may be seen that there has been provided, in accordance with the present invention, an improved hysteresis type comparator circuit and a variable reference signal generator circuit for selectively producing a first and a second pair of reference signals.

The embodiments of the invention in which an exclusive property or privilege is claimed are defined as follows:

1. A signal comparator comprising
   a first signal comparator means having hysteresis,
   a second signal comparator means having hysteresis, said first and said second signal comparators each comparing an input signal with a reference signal to produce an output signal level representative of the relative magnitude between the compared signals,
   input signal means for connecting a first input of each of said comparator means to a source of an input signal to be compared,
   first reference signal generating means for generating a first reference signal level in a first mode of operation and a second reference signal level in a second mode of operation,
   first circuit means for connecting an output from said first reference signal generating means to a reference signal input of said first comparator means,
   second reference signal generating means for generating a first reference signal in a first mode of operation and a second reference signal in a second mode of operation,
   second circuit means for connecting an output of said second reference signal generating means to a reference signal input of said second comparator means, and
   control means for concurrently and selectively operating said first signal generating means and said second signal generating means in said first mode of operation and said first signal generating means and said second signal generating means in said second mode of operation.

2. A signal comparator circuit as set forth in claim 1 wherein said first and said second signal generating means each includes an operational amplifier having an inverting and a non-inverting input, a source of a fixed signal level connected to said non-inverting input of said operational amplifier and a feedback loop around said operational amplifier connected between an output thereof and said inverting input of said operational amplifier.

3. A signal comparator as set forth in claim 2 wherein said control means includes a signal inverter means having an input and having an output connected to said non-inverting input of said operational amplifier of said first signal generator means,
   a resistor means connecting an input of said inverter means to ground and
   a switching means connecting said inverting input of said operational amplifier of said second signal generating means to said input of said inverter means.

4. A method of operating a comparator circuit having hysteresis type signal comparator for performing a comparison operation of a input signal with a reference signal level comprising the steps of applying an input signal to a first input of said comparator, applying a reference signal to a second input of said comparator and selectively altering said reference signal level from a first level to a second level and returning said reference signal to said first level during the comparison operation of said input signal.

5. A method of operating a signal comparator circuit having a pair of hysteresis type comparators for comparing an input signal with respective ones of a high and a low reference signal level comprising the steps of applying an input signal concurrently as a first input signal to said first and second comparators, applying a high and a low reference signal level as a second input to respective ones of said first and second comparators and selectively and concurrently altering said high and low reference signal levels between a first to a second level and return, respectively.

6. A method as set forth in claim 5 wherein said second level of said high reference signal is of a higher level than said first level of said high reference signal and wherein said second level of said low reference signal is lower than said first level of said low reference signal.

7. A method as set forth in claim 4 wherein said reference signal level is altered in said second level to shift a hysteresis loop of said signal comparator past a hysteresis loop location for said reference signal level in said first level.

8. A method as set forth in claim 5 wherein said high and low reference signal levels are altered in said second level to shift a hysteresis loop for said first and second comparators past a hysteresis loop location for said reference signal levels in said first level.

9. A method as set forth in claim 5 wherein said first and second reference signals are altered in opposite directions between said first and second levels.

10. A method as set forth in claim 8 wherein said first and second reference signals are altered in opposite directions between said first and second levels.

* * * * *